United States Patent
Chuah et al.

(10) Patent No.: US 11,784,118 B2
(45) Date of Patent: Oct. 10, 2023

(54) ON-DIE TERMINATION (ODT) CIRCUIT CONFIGURABLE WITH VIA LAYER TO SUPPORT MULTIPLE STANDARDS

(71) Applicant: Intel Corporation, Santa Clara, CA (US)

(72) Inventors: Eah Loon Alan Chuah, Tanjung Tokong (MY); Ting Ting Au, Bayan Lepas (MY)

(73) Assignee: INTEL CORPORATION, Santa Clara, CA (US)

( * ) Notice: Subject to any disclaimer, the term of this patent is extended or adjusted under 35 U.S.C. 154(b) by 780 days.

(21) Appl. No.: 16/723,901

(22) Filed: Dec. 20, 2019

(65) Prior Publication Data

US 2020/0126910 A1    Apr. 23, 2020

(51) Int. Cl.
| | |
|---|---|
| H01L 23/50 | (2006.01) |
| H01L 23/522 | (2006.01) |
| H03K 19/00 | (2006.01) |
| H01L 23/62 | (2006.01) |
| H01L 21/768 | (2006.01) |
| H01L 21/027 | (2006.01) |
| H01L 23/525 | (2006.01) |

(52) U.S. Cl.
CPC ...... *H01L 23/5226* (2013.01); *H01L 21/0274* (2013.01); *H01L 21/76802* (2013.01); *H01L 21/76877* (2013.01); *H01L 23/525* (2013.01); *H01L 23/62* (2013.01); *H03K 19/0005* (2013.01)

(58) Field of Classification Search
CPC ........... H01L 21/0274; H01L 21/76802; H01L 21/76877; H01L 23/5226; H01L 23/525; H01L 23/62; H03K 19/0005
See application file for complete search history.

(56) References Cited

U.S. PATENT DOCUMENTS

| | | | |
|---|---|---|---|
| 10,079,603 B1 * | 9/2018 | Panigrahi | H03K 5/13 |
| 2020/0092014 A1 * | 3/2020 | de Rochemont | H03H 7/52 |

* cited by examiner

*Primary Examiner* — Kurtis R Bahr
(74) *Attorney, Agent, or Firm* — Fletcher Yoder, P.C.

(57) ABSTRACT

An integrated circuit device with a single via layer, in which the via layer includes selectable via sites and/or jumpers. The selectable via sites and/or placement of jumpers may be used to configure and interconnect components and circuitry between distinct layers of multilayer circuits. In some implementations, selectively enabling via sites by filling via openings and/or using jumpers may implement a single-ended termination circuit with a first via configuration, a Thevenin termination circuit with a second via configuration, and/or a differential termination circuit with a third configuration.

16 Claims, 16 Drawing Sheets

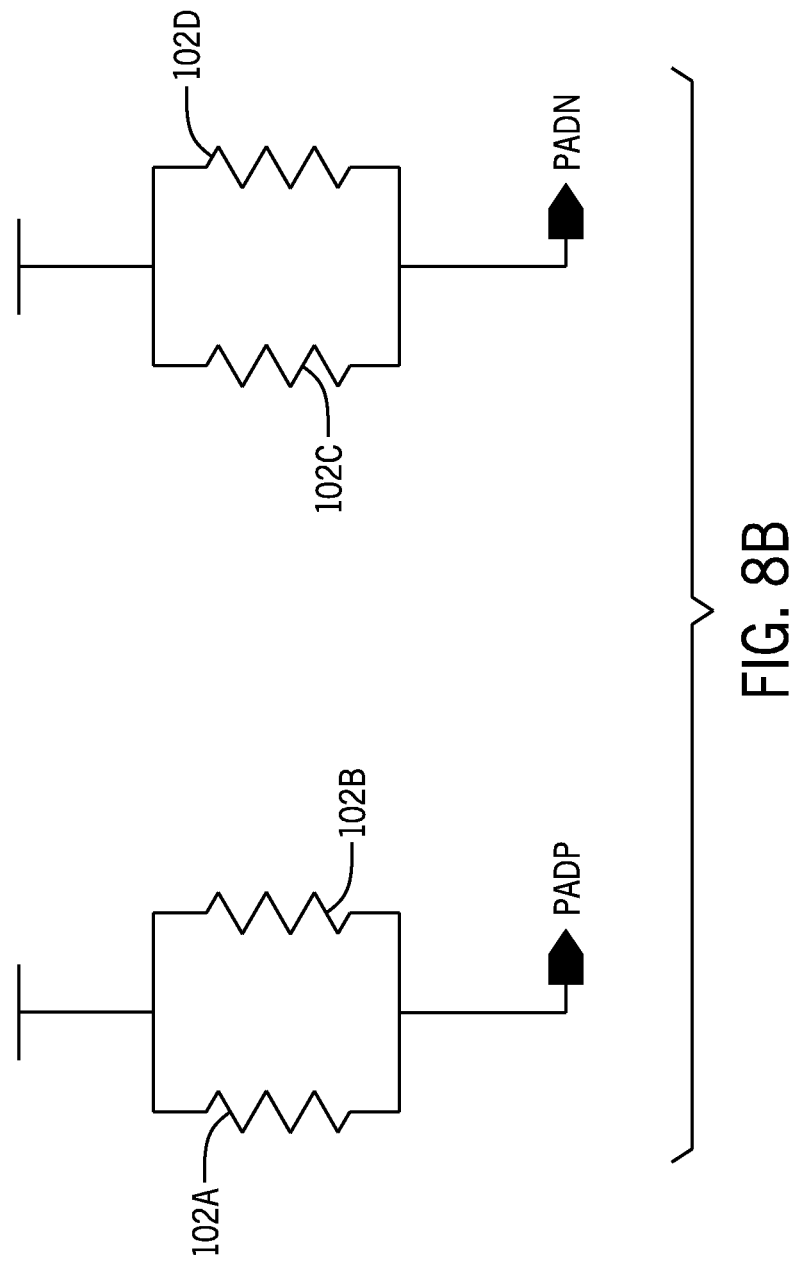

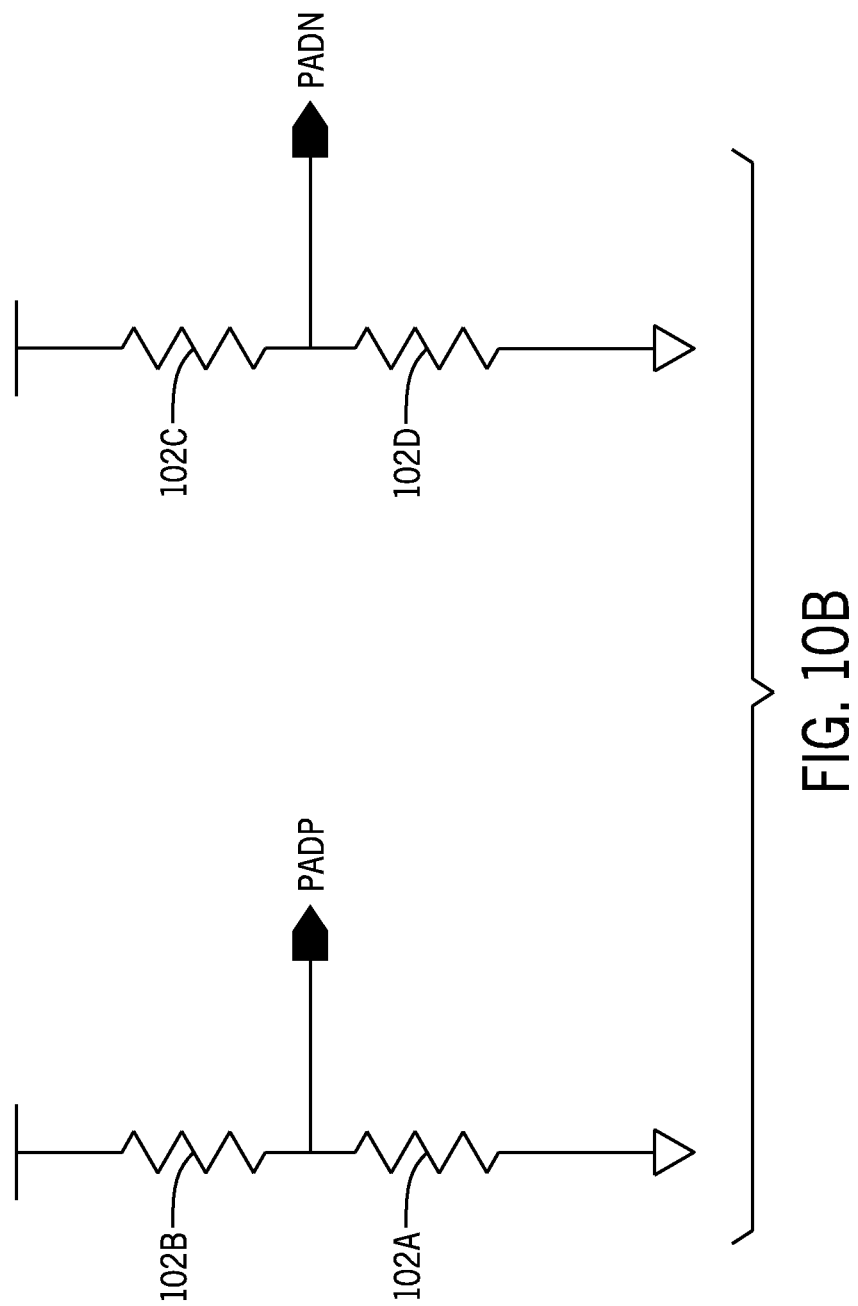

US 11,784,118 B2

ON-DIE TERMINATION (ODT) CIRCUIT CONFIGURABLE WITH VIA LAYER TO SUPPORT MULTIPLE STANDARDS

BACKGROUND

The present disclosure relates to an integrated circuit device used to support different applications by configuring via connections of a via layer.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices are used in numerous electronic systems. Computers, handheld devices, portable phones, televisions, industrial control systems, robotics, and telecommunication networking—to name just a few—all use integrated circuit devices. Integrated circuit devices may be developed using lithography techniques that pattern circuitry onto a substrate wafer that is diced to form a number of (generally identical) individual integrated circuit die. Each integrated circuit die for a particular application may include many different components, such as programmable logic fabric, digital or analog signal transmission circuitry, digital signal processing circuitry, application-specific data processing circuitry, memory, and so forth. The lithography techniques to form circuits on an integrated circuit die may involve using a variety of different steps, possibly including one or more photomasks (e.g., a photomask set) corresponding to that specific circuitry on the integrated circuit die. In other words, manufacturing an integrated circuit die that has a first functionality may involve a completely different process and/or photomask set as compared to an integrated circuit die that has a second functionality.

BRIEF DESCRIPTION OF THE DRAWINGS

Various aspects of this disclosure may be better understood upon reading the following detailed description and upon reference to the drawings in which:

FIG. 8B illustrates a simplified schematic diagram of the configurable ODT circuitry of FIG. 8A, in accordance with an embodiment of the present disclosure;

FIG. 10B illustrates a simplified schematic diagram of the configurable ODT circuitry of FIG. 10A, in accordance with an embodiment of the present disclosure;

DETAILED DESCRIPTION OF SPECIFIC EMBODIMENTS

Figure 1:
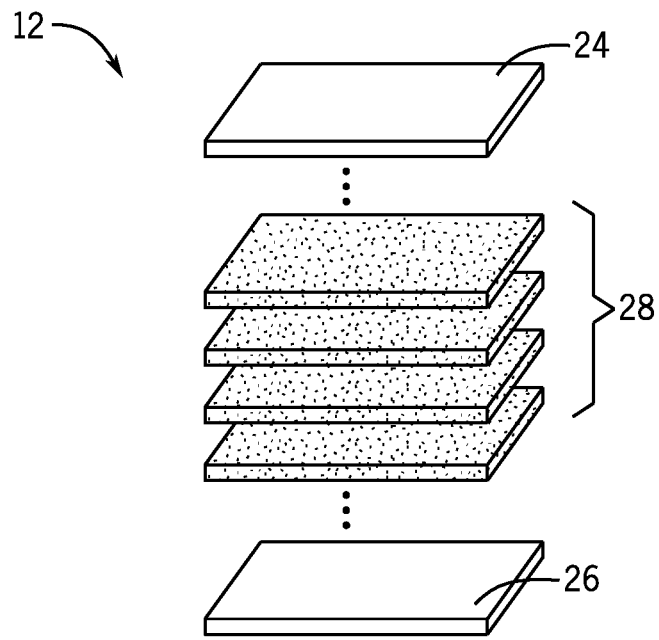
FIG. 1 is a three-dimensional schematic diagram illustrating multiple layers of an integrated circuit device, including some layers that are the same across several integrated circuit devices, and one or more via layers that may be changed in manufacturing to cause the integrated circuit device to support different applications, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

In some implementations, integrated circuit devices include multiple layers, and often, these layers are fabricated in a sequential process. Accordingly, each of the multiple layers may be fabricated using a unique photomask or set of photomasks. As such, at least some of the photomask patterns used for a specific circuit design may not be used for a different circuit design. Thus, producing multiple photomasks for the various integrated circuit devices and/or their multiple layers may have their own respective costs.

The integrated circuit device for a particular application may include one circuit to perform one function and another circuit to perform another function of the application. By way of example, an electronic signal transmitted on-chip between circuits or off-chip between other integrated circuits, may use different formats or standards. Each of these standards may be supported by a particular circuit and be associated with separate respective photomasks. However, the circuits for each of these different standards may include common components.

It may be desirable to maintain a single integrated circuit architecture with a termination circuit that is configurable to support each of these standards. Moreover, since a single circuit with common circuitry may be used to support the various standards, the overall costs of producing multiple photomasks for each circuit and/or multiple integrated circuit layers may be mitigated. To implement a configurable termination circuit in an integrated circuit device that may be configurable for various applications, a via layer may be used to connect components and circuitry between the layers of the integrated circuit device. Thus, via openings may be selectively located and formed (e.g., filled or coated with metal) on the via layer to create interconnections between the various components to implement a particular input/output (I/O) termination standard in the integrated circuit device. For example, a single circuit with a via layer may be used to configure the circuitry to implement a single-ended termination circuit, a Thevenin termination circuit, and/or a differential termination circuit. Moreover, the circuitry may be configured to tolerate voltage overstress, such as by using protection biasing. While this disclosure will primarily use the example of an application specific integrated circuit (ASIC), the systems and methods of this disclosure may apply to any suitable integrated circuit devices. For example, the methods and devices may be incorporated into numerous types of devices such as microprocessors, system on chip (SoC), or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs) logic cell arrays (LCAs), field programmable gate arrays (FPGAs), application specific standard products (ASSPs), and microprocessors, just to name a few.

With the foregoing in mind, FIG. 1 illustrates an integrated circuit device 12 that may be associated with multiple photomasks. FIG. 1 shows a three-dimensional diagram of the integrated circuit device 12 with multiple layers of circuitry. As shown, the integrated circuit device 12 may include a first circuit layer 24 and a second circuit layer 26. Although the depicted embodiment illustrates a first circuit layer 24 and a second circuit layer 26, which represents a particular embodiment, it should be noted that the methods and systems described herein may also be performed and implemented for integrated circuit devices 12 having more than two layers (e.g., 4 layers, 18 layers, 24 layers, and so forth).

Circuit components for on die termination may be attached or embedded into either the first circuit layer 24 and/or the second circuit layer 26 and their electrical connections may be routed on their respective first circuit layer 24 and second circuit layer 26.

The circuit layers 24 and 26 may be designed to have a variety of possible connections at a variety of possible via sites. Vias are integrated circuit structures that allow circuitry on one layer to form a connection with circuitry on another layer. Depending on the via configuration of one or more via layers 28, the circuit layers 24 and 26 may have different functionalities. Thus, many different on die termination specifications may be manufactured using the same circuit layers 24 and 26, but the integrated circuit devices 12 may be manufactured to have different on die termination specifications by selecting a different via configuration for the one or more via layers 28. Although the depicted embodiment illustrates a first circuit layer 24 and a second circuit layer 26, which represents a particular embodiment, it should be noted that the methods and systems described herein may also be performed and implemented for integrated circuit devices 12 having more than two layers (e.g., 4 layers, 18 layers, 24 layers, and so forth). Moreover, one or more via layers 28 may also be disposed to connect to an outer surface for selectively connecting to circuitry in a 2.5D or 3D configuration (e.g., another integrated circuit device 12, an interposer, or Embedded Multi-Die Interconnect Bridge (EMIB) by Intel Corporation®).

The one or more via layers 28 may be manufactured to have a variety of different possible via configurations, where each via configuration provides different connections that determine the functionality of the first circuit layer 24 and the second circuit layer 26, even while the one or more via layers 28 may not be changed. Thus, by manufacturing the one or more via layers 28 using a particular selected photomask or photomask set, a functionality of the circuit layers 24 and 26 may be controlled.

Figure 2:
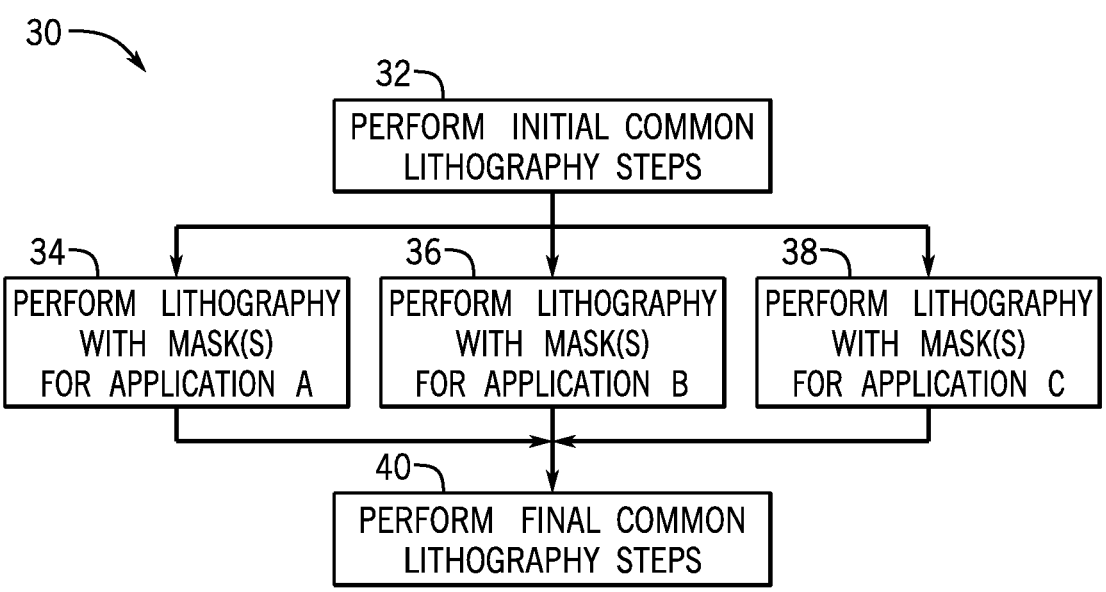
FIG. 2 is a process flow diagram of a lithography process to fabricate the integrated circuit device with a via layer for various applications, in accordance with an embodiment of the present disclosure.

To illustrate, FIG. 2 shows a process flow diagram of process 30 for fabricating an integrated circuit device 12 with a particular via layer that causes the integrated circuit device 12 to selectively provide functionality for one or many different applications depending on the via configuration of the via layer. In general, the overall process 30 for fabricating integrated circuit devices 12 for each particular application includes steps of depositing, patterning, removing, and modifying electrical properties. As shown, the process may begin with performing (block 32) initial common lithography steps. These steps may include the depositing process, which includes coating or transferring photoresist material (e.g., liquid polymeric material or dry film photoresists) onto a substrate, such as a wafer. The photoresist is material that the image may be transferred to during the patterning process.

Patterning may include fabricating a pattern from a photomask onto the wafer by exposing the wafer to light using the photomask. As previously discussed, photomasks are often formed from silica plates with a pattern, such as a circuit pattern, of opaque and transparent areas that are projected onto the wafer to define the layout of the integrated circuit. In some implementations, a set of photomasks may be used to define one or more pattern layers of the multilayered structure of the integrated circuit device 12. In general, the photomask is placed over the substrate and a short-wavelength light is passed through to project the pattern onto the substrate surface.

While the common lithography steps of block 32 are common to all versions of the integrated circuit device 12 that are manufactured using the process 30, different versions of the integrated circuit device 12 may have different functionalities associated with different applications (e.g., shown here as Application A, Application B, and Application C) depending on the particular via configuration of a via layer of the integrated circuit device 12. Thus, the process 30 may also include performing (block 34) lithography with mask(s) for Application A (e.g., a single-ended termination circuit) that produces one or more via layers that will form connections that cause the circuitry formed at block 32 to operate with a first functionality (e.g., single-ended termination). On the other hand, the process 30 may include performing (block 36) lithograph with mask(s) for Application B (e.g., a Thevenin termination circuit) that produces one or more via layers that will form connections that cause the circuitry formed at block 32 to operate with a second functionality (e.g., Thevenin termination). Further, the process 30 may include performing (block 38) lithography with mask(s) for Application C (e.g., a differential termination circuit) that produces one or more via layers that will form connections that cause the circuitry formed at block 32 to operate with a third functionality (e.g., differential termination) associated with Application C. Specifically, performing lithography for each of these applications may include selecting via sites of the via layer to configure for either the integrated circuit device for Application A, Application B, or Application C. Thus, the one or more via layer photomasks or photomask sets are used to pattern and selectively connect components for each of the different integrated circuit devices 12 (e.g., integrated circuits for each Application A, B, and C) that may be manufactured by the process 30.

The process 30 may also include performing (block 40) certain final common lithography steps, which may include steps related to the removal of coating and modification of electrical properties.

The location of the multiple via sites or openings may be based on the various possible application functions to be performed and the components used to perform such functions. The selectable via sites may be filled (e.g., configured or selected) or remain unfilled (e.g., not selected) depending on the specific application to be performed. Thus, when the via layer is configured for Application A by selecting particular via sites that connect the corresponding components to perform Application A, there may be via sites that remain unselected since the components connected to those via sites may not be used to perform the functions of Application A. Similarly, some of the via sites used to perform application A may not be selected when the via layer is configured for Application B. As such, using a lithography process for each particular application (e.g., Applications A, B, and C) may be mitigated or avoided by using the configurable via layer. Thus, fewer photomasks and/or application specific integrated circuit devices 12 may be manufactured, resulting in lower manufacturing costs and more efficient integrated circuit devices 12. Upon configuring the via layer for the particular application, such as by selecting particular vias (e.g., filing via openings with metal) to interconnect components used for the particular application, the integrated circuit, or at least those vias selected, may have a static configuration.

Figure 3A:
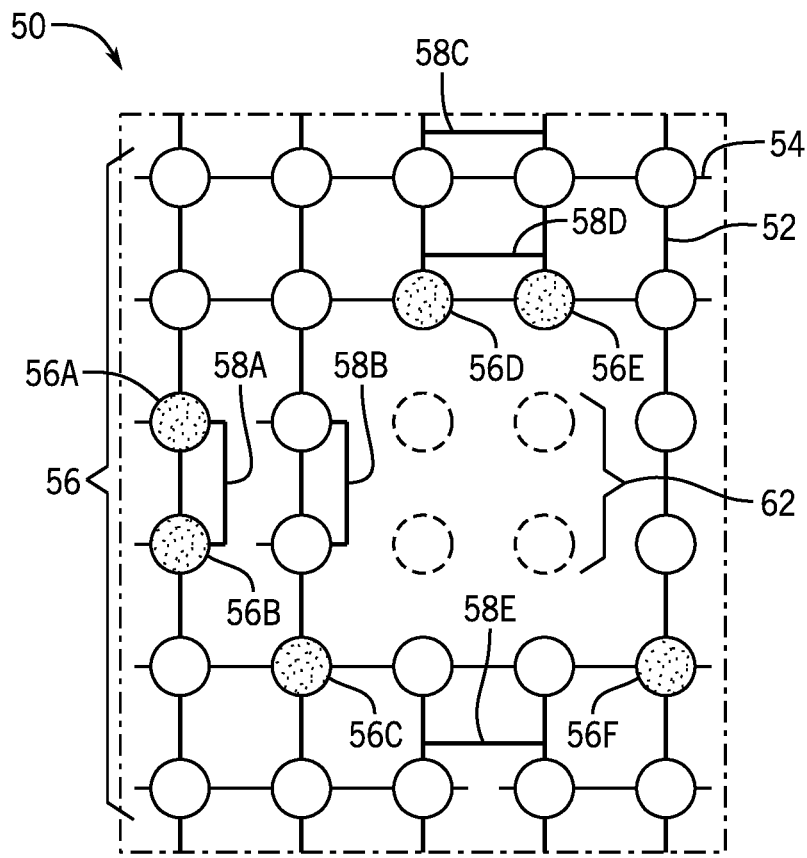
FIG. 3A is a block diagram of a via layer with via connections between multiple layers of the integrated circuit device, in accordance with an embodiment of the present disclosure.

To facilitate the reuse of circuitry or components between the layers of the single integrated circuit device 12 to implement different applications, vias may be used. For example, and referring back to Applications A and B, some of the circuitry components that are used for Application A may also be used for the circuitry for Application B. Thus, these circuitry components may be reused when the via layer is configured for either Application A or Application B. To illustrate, FIG. 3A, which represents a particular embodiment, depicts an integrated circuit device 12 with a via layer 50 (e.g., one or more via layers 28 of FIG. 1) including selectable via sites 56 that may connect components and/or circuitry residing on different layers of the integrated circuit device 12. Although the integrated circuit device 12 is discussed as having two layers (e.g., first circuit layer 24 and second circuit layer 26 of FIG. 1) in the current embodiment, it should be appreciated that three or more layers may be used to implement different applications or functions using the vias connections described herein. The additional via layers 50 may be used to connect components between the three or more layers.

As shown, the via layer 50 may include a vertical segment layer 52 (as indicated by the vertical bold lines) of metal segments and a horizontal segment layer 54 (as indicated by the horizontal and relatively thinner lines) of metal segments. The vertical segment layer 52 and the horizontal segment layer 54 may each include selectable via sites 56, which may be used to interconnect segments of the vertical and horizontal segment layers 52 and 54. In some implementations, jumpers 58 may be selectively placed vertically or horizontally along the segments of the vertical segment layer 52 and the horizontal segment layer 54 to facilitate vias connections that may otherwise be disconnected. For example, the jumpers 58 may facilitate in connecting or disconnecting via sites 56 to connect or disconnect segments. As such, the via layer 50 may be reconfigured using the jumpers 58. The circuitry components on the first circuit layer 24 and the second circuit layer 26 that are connected to a respective segment of the via layer 50 (e.g., vertical segment layer 52 and the horizontal segment layer 54) may be connected or disconnected using the via sites 56 to form a circuit for a particular application.

To illustrate, selected vias (e.g., via sites filled with metal to create interconnection) are indicated by darkened selectable via sites 56 in the depicted embodiments. As shown, jumpers 58A, B, C, D, and E create a link between selectable via sites 56 that are on the same segment layer. For example, selectable via sites 56A and 56B may reside on separate segments of the vertical segment layer 52. Accordingly, jumper 58A may connect these two segments, such that when the selectable via sites 56A and 56B are selected, components and/or circuitry on their respective segments may be connected. Similarly, jumpers 58B, 58C, 58D, and 58E may connect selectable via sites 56, such that the jumpers 58 allow a connection to be made between segments of the vertical segment layer 52 or the horizontal segment layer 54, and between the vertical segment layer 52 and the horizontal segment layer 54 when their respective selectable via sites 56 are selected.

Although jumpers 58 may be placed between segments of the vertical segment layer 52 and the horizontal segment layer 54, some of the selectable via sites 56 may not be selected, as indicated by the white selectable via sites 56. In such instances, segments of vertical segment layer 52 and the horizontal segment layer 54 may not be connected. For example, jumper 58E may connect two segments of the horizontal segment layer 54 when the selectable via sites 56 are selected. Since these selectable via sites 56 are not selected, the segments may not be connected and thus, the components or circuitry on those segments may not be interconnected. Moreover, in some implementations, non-selectable via sites 62 may exist on the vertical segment layer 52 and/or the horizontal segment layer 54. The non-selectable via sites 62 may include areas that may not be suitable for a selectable via site 56. These areas may not be adjacent or parallel to components on the other layers, may include jumper connections, or that may include base circuitry or application specific circuitry that is not compatible for use for a different application.

Figure 3B:
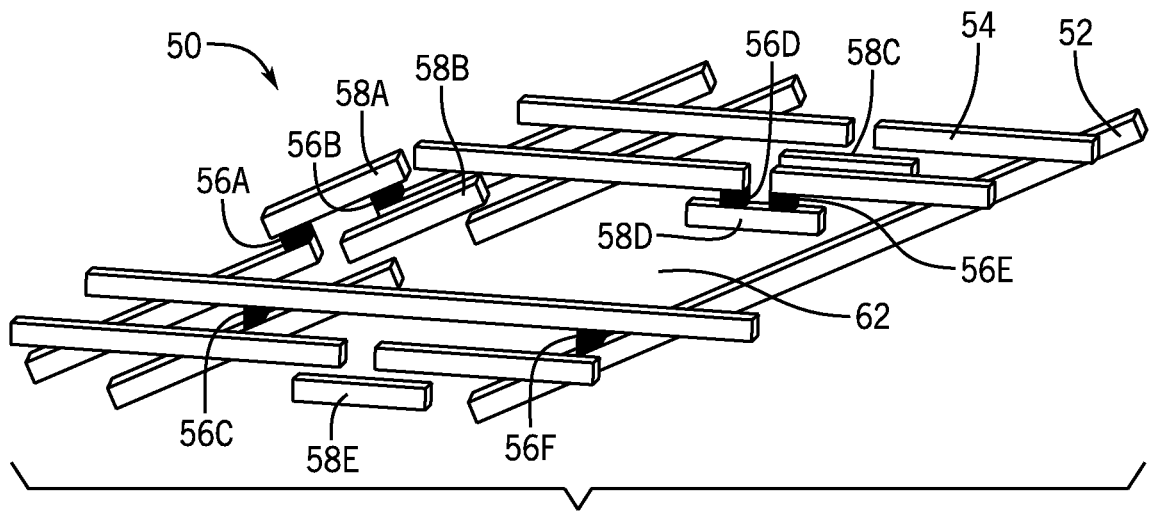
FIG. 3B is a three dimensional block diagram of the via layer of FIG. 3A, in accordance with an embodiment of the present disclosure.

To further illustrate the connections between the layers 52 and 54 using jumpers 58 and/or selectable via sites 56, FIG. 3B depicts a three dimensional (3-D) diagram of the via layer 50 of FIG. 2. As shown, segments of the vertical segment layer 52 and the horizontal segment layer 54 may be connected using jumpers 58 and selectable via sites 56 connections that correspond to FIG. 3A. For example, selectable via sites 56A and 56B may reside on separate segments of the first layer 52. Accordingly, jumper 58A may connect these two segments, such that when the selectable via sites 56A and 56B are selected, components and/or circuitry on their respective layer segments may be connected. Also corresponding to FIG. 3A, jumpers 58B, 58C, 58D, and 58E may connect selectable via sites 56, such that jumpers 58 allow a connection to be made between segments of the vertical segment layer 52 and the horizontal segment layer 54, and between the vertical segment layer 52 and the horizontal segment layer 54 when their respective selectable via sites 56 are selected. These segments of layers 52 and 54 may include components and/or circuitry that may be connected to perform specific functions.

Specifically, the selectable via sites 56 that are selected may be active sites used to short the path between the vertical segment layer 52 and the horizontal segment layer 54. In this manner, the components on the portion of the layer connected to the via site 56 may be used or unused depending on the selection of the selectable via site 56. Thus, using vias may reduce the number application specific circuits and layers, and correspondingly, reduce the number of photomasks used to produce each of the layers. Moreover, since circuit components between layers of the integrated circuit device 12 may be reused, vias may reduce the amount of circuitry and silicon area that may otherwise be used for each application.

As previously discussed, the integrated circuit device 12 may include an input output termination circuit. A termination circuit for multiple standards (e.g., single-ended termination circuit, Thevenin termination circuit, etc.) may each be formed using separate photomasks. However, both these termination circuits may include common components. As will be described herein, rather than forming separate termination circuits, the single via layer 50 may be used to connect the redundant components of circuitry between layers of the integrated circuit device 12 to configure circuitry and implement the various termination circuit standards in the integrated circuit device 12. As used herein, redundant components may refer to one or more common components to the circuit resulting from a first configuration, such as a single-ended termination configuration, and the circuit resulting from a different configuration, such as a Thevenin termination configuration. Additionally or alternatively to selectable via sites 56, multiplexers may be used to dynamically configure and select specific circuitry to implement any of the termination circuit standards.

Figure 4:
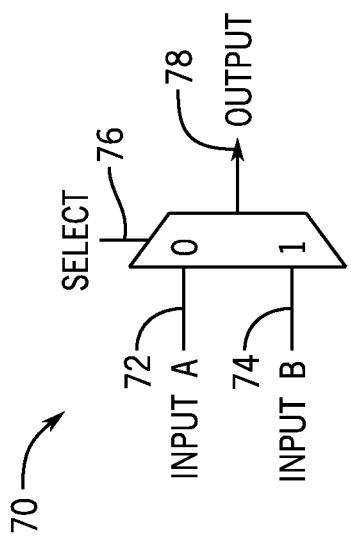
FIG. 4 is a schematic diagram of a multiplexer used to configure circuitry of the integrated circuit device, in accordance with an embodiment of the present disclosure.

To illustrate, FIG. 4 depicts a multiplexer 70 that may be dynamically configured and programmed to select a termination circuit. As shown, the multiplexer 70 may include two input ports, input A 72 and input B 74, one control select signal, select 76, and an output port, output 78. A control select signal at select 76 may be used to control which input port (e.g., input A 72 or input B 74) is utilized to select one of the termination circuits (e.g., single-ended termination circuit, Thevenin termination circuit, or differential termination circuit) or components of the termination circuit. For example, input A 72 may be used for the output 78 when the control signal at select 76 has a value of "0". On the other hand, input B 74 may be used for the output 78 when the control signal at select 76 has a value of "1". Thus, to implement the single-ended termination circuit, the Thevenin termination circuit, the differential termination circuit, or components of these particular termination circuits, input A 72 or input B 74 may be selectively enabled using select 76.

Figure 5:
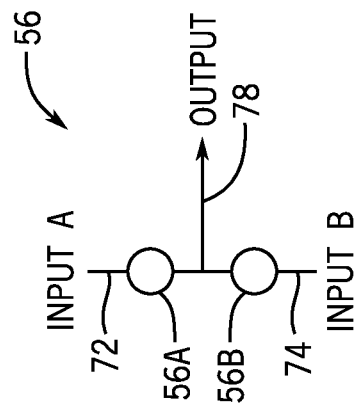
FIG. 5 is a schematic diagram of a via connection of the via layer used to configure circuitry of the integrated circuit device, in accordance with an embodiment of the present disclosure.

In other embodiments, vias may be used in conjunction with or in place of multiplexer 70 of FIG. 4. To illustrate, FIG. 5 depicts a static configuration of via sites 56 (e.g., selectable via sites 56 of FIG. 3) that may be selected (e.g., via openings filled with metal to create interconnection) to implement a particular application. As shown, the via site 56A may connect an input A 72 to output an output 78 when selected, or via site 56B may connect an input B 74 to output a different result of output 78 when selected. Circuitry and components of input a 72 connected to via site 56A may be enabled for use upon selection of the via site 56A. Similarly, circuitry or components of input B 74 that are connected to via site 56B, may be enabled for use upon selection or activation of the via site 56B.

Thus, by selecting or activating particular via sites 56A or 56B, the circuitry of the selected inputs (e.g., input A 72 or input B 74) may be included in the integrated circuit device 12 to be used for a particular termination circuit. Via sites 56 may be selected or unselected (e.g., remain unfilled) based on the application to be executed and the circuitry used for the particular application. As previously mentioned, via sites 56 of the via layer 50 may be selected to configure the integrated circuit device 12 by connecting redundant circuitry between the various layers of the integrated circuit device 12. In this manner, producing additional mask layers associated with each application specific integrated circuit device 12 and/or circuitry for a particular application of the integrated circuit device 12 may be mitigated.

Figure 6:
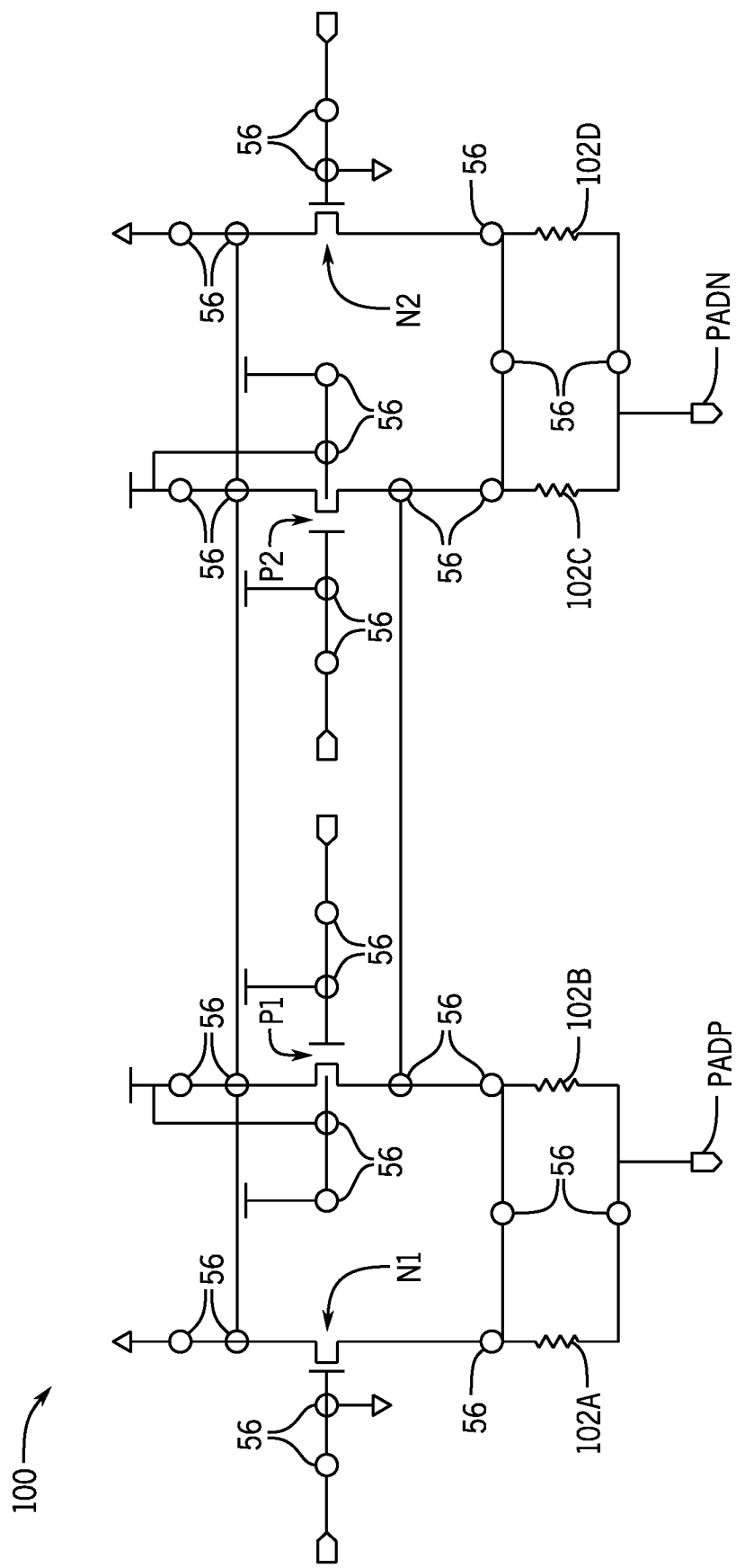
FIG. 6 illustrates a schematic diagram of configurable On-Die Termination (ODT) circuitry with a via layer, in accordance with an embodiment of the present disclosure.

To illustrate, FIG. 6 shows configurable ODT circuit 100 that may be configured using via sites 56 of the via layer 50, to facilitate the same single circuitry to function for a particular termination standard. For example, the circuit may be configured for one termination standard (e.g., differential termination) or another termination standard (e.g., two independent single-ended terminations) to support different technologies by selecting specific via sites 56. The circuitry may include a series of components such as a series of resistors 102A, 102B, 102C, 102D and a series of metal-oxide semiconductor field effect transistors (MOSFET) (e.g., N1, N2, P1, P2). Each of the transistors may act as switches to connect and disconnect components and electrical signals when a particular voltage is applied to their respective gates.

The configurable ODT circuit 100 may be configured to support various power supply values and/or resistance values based on the termination standard. These different configurations may be provided by selectively enabling one or more via sites 56 on one or more via layers 50 to connect or disconnect components connected to segments of the respective via site 56. As previously mentioned, via sites 56 may be selected or enabled by filling the via opening of the via site 56 with metal to interconnect the components connected to the respective via site 56. As shown, multiple via sites 56 are connected to the various components of the configurable ODT circuit 100, and thus, may be enabled to implement a particular termination circuit, as will be discussed in FIGS. 7A-11C.

Figure 7A:
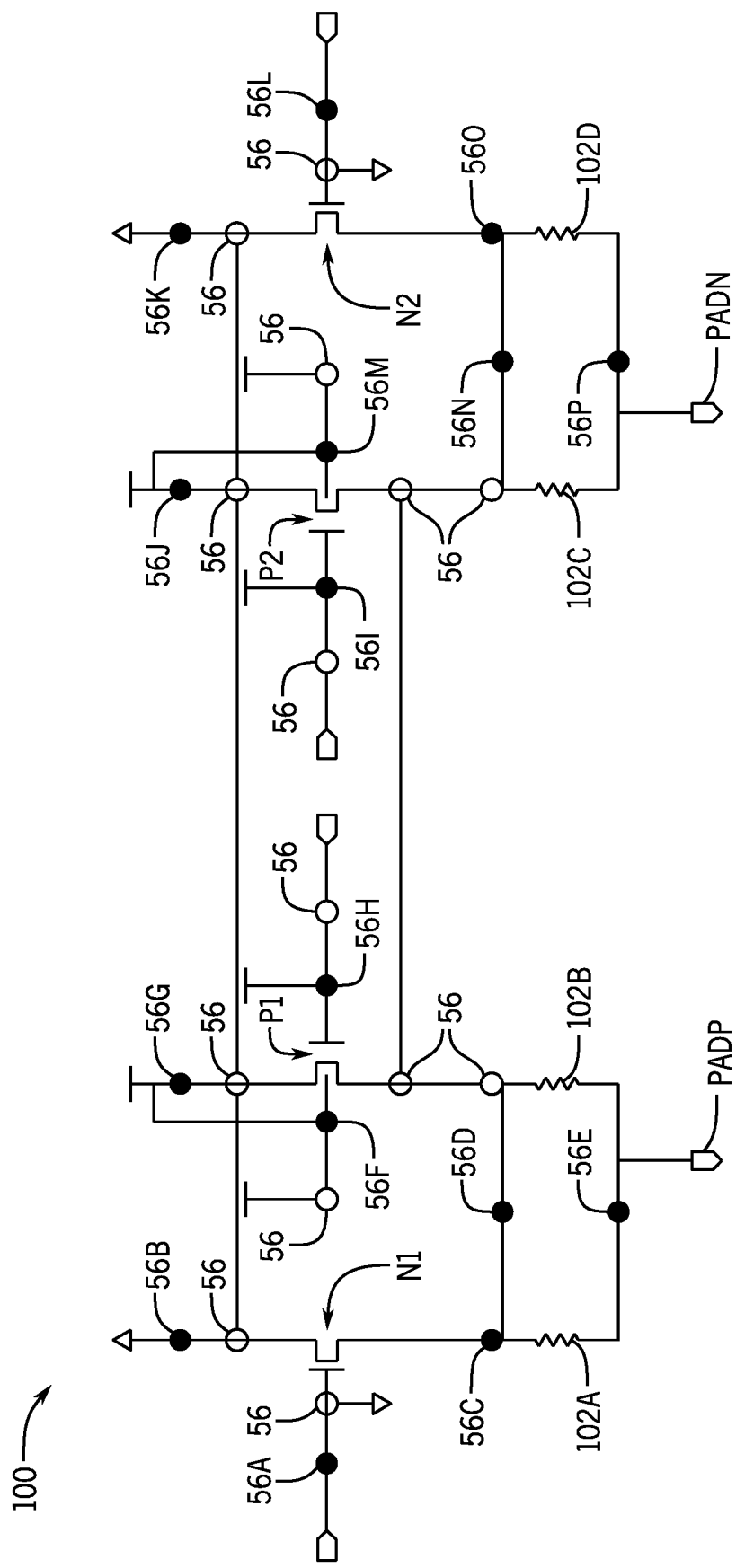
FIG. 7A illustrates a schematic diagram of the configurable ODT circuitry of FIG. 6 in a first via configuration, the configurable ODT circuitry configured as a pair of pull-down termination to ground circuits, in accordance with an embodiment of the present disclosure.
Figure 7B:
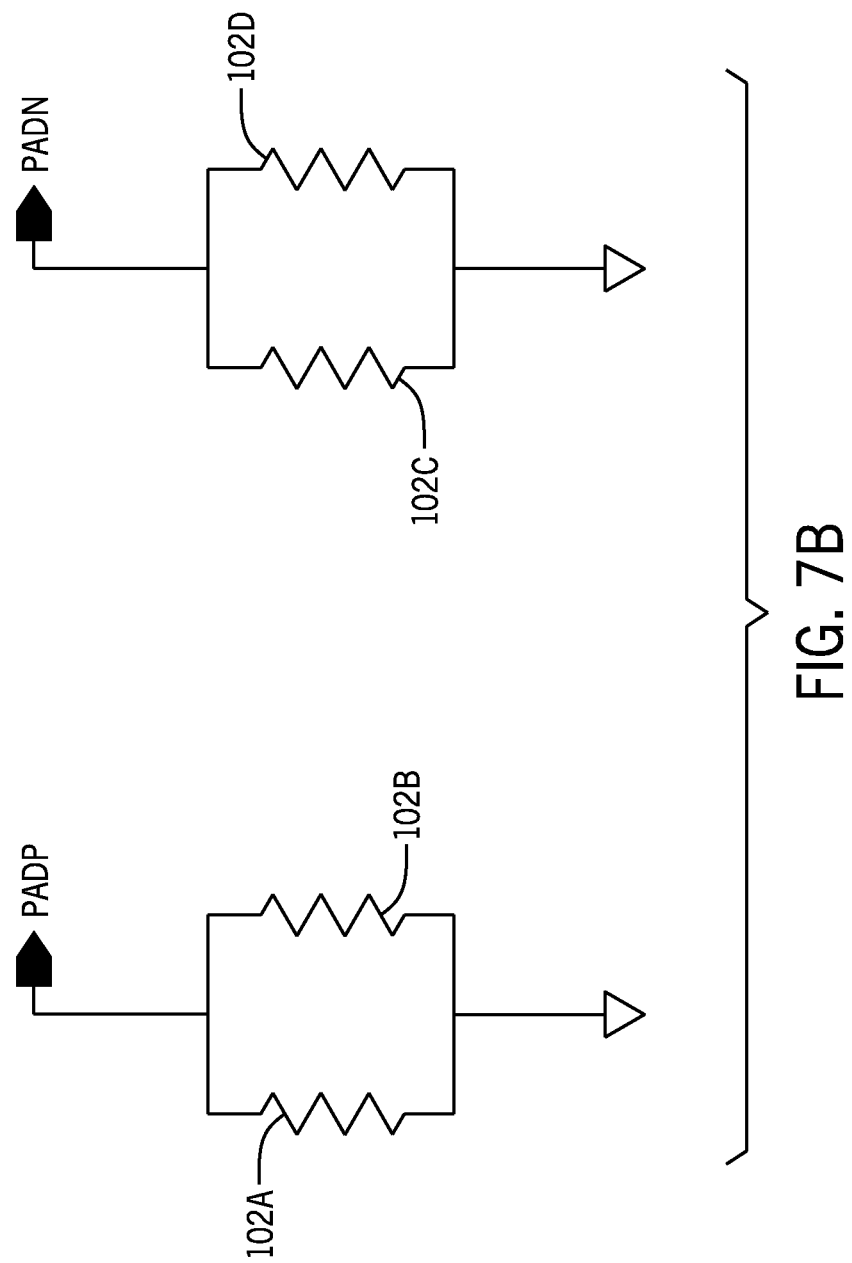
FIG. 7B illustrates a simplified schematic diagram of the configurable ODT circuitry of FIG. 7A, in accordance with an embodiment of the present disclosure.

FIG. 7A illustrates the configurable ODT circuit 100 of FIG. 6 in a first via configuration, the configurable ODT circuit 100 configured as a pair of single-ended termination circuits, such as pull-down termination to ground circuits at Pad P and Pad N. As shown, some via sites 56 may be selected, as indicated by the dark shading, to interconnect the components between the low layers 52, 54. For example, portions of the depicted configurable ODT circuit 100 may reside on different layers (e.g., layer 52 and 54) and as such, via sites 56 may be used to interconnect these components to implement the pull-down termination to ground circuit. The pull-down termination to ground circuits may include, but are not limited to, Double Data Rate 2 (DDR2), Double Data Rate 3 (DDR3), Double Data Rate 4 (DDR4), Low-Power Double Data Rate 4 (LPDDR4), Reduced Latency Dynamic Random-Access Memory (DRAM) 3 (RLDRAM3), and Open NAND Flash Interface (ONFI). As shown, via sites 56A, 56B, 56C, 56D, 56E, 56F, 56G, 56H, 56I, 56J, 56K, 56L, 56M, 56N, 56O, 56P are selected, connecting circuitry components to implement a pair of pull-down termination to ground circuits. FIG. 7B illustrates a simplified schematic illustration of the two pull-down termination to ground circuits at Pad P and Pad N.

Figure 8A:
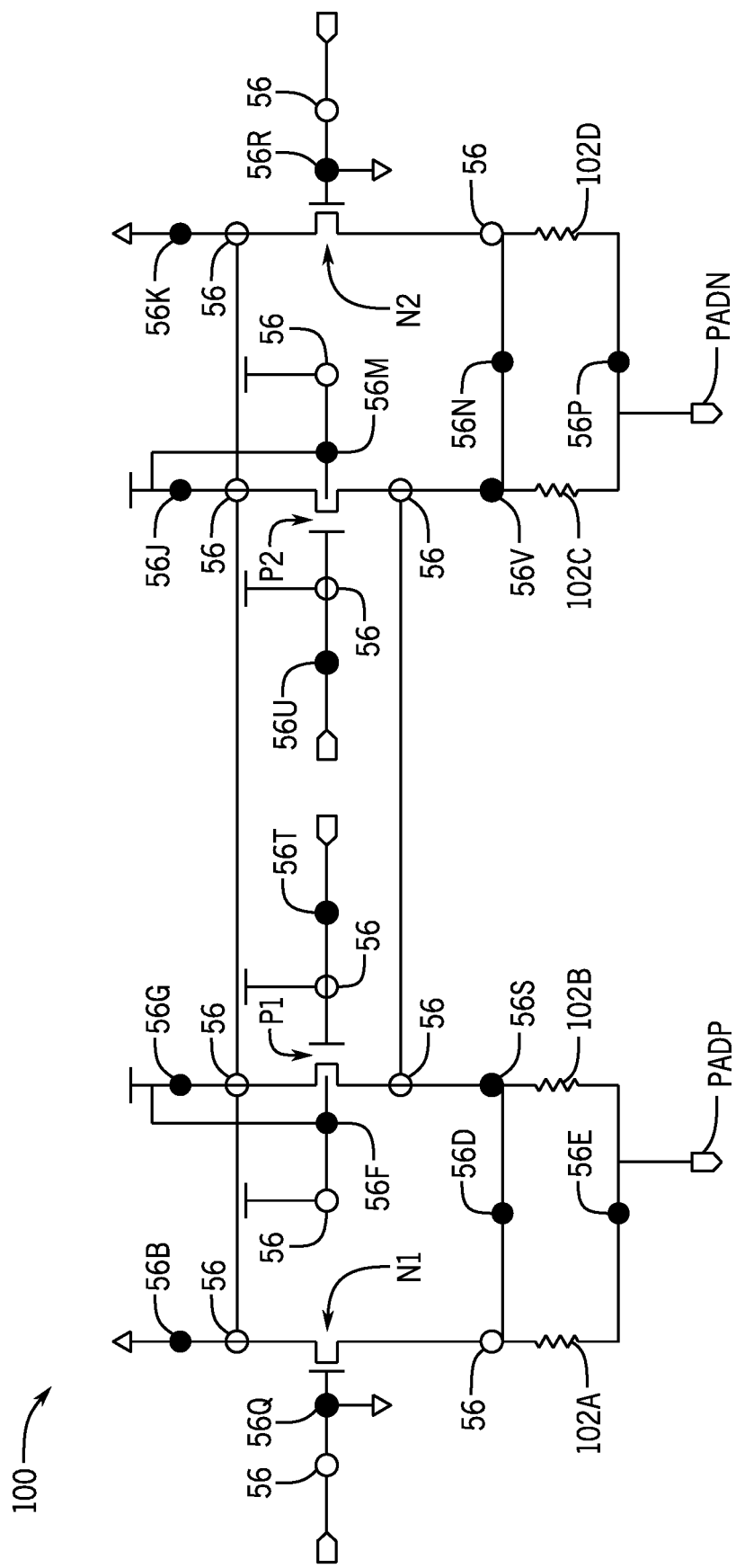
FIG. 8A illustrates a schematic diagram of the configurable ODT circuitry of FIG. 6 in a second via configuration, the configurable ODT circuitry configured as a pair of pull-up termination to power rail circuits, in accordance with an embodiment of the present disclosure.

FIG. 8A illustrates the configurable ODT circuit 100 of FIG. 6 in a second via configuration, the configurable ODT circuit 100 configured as a pair of single-ended termination circuits, such as two pull-up termination to power rail circuits at Pad P and Pad N. For example, the pull-up termination to power rail circuits may include, but are not limited, to DDR2, DDR3, DDR4, LPDDR4, RLDRAM3, and ONFI. As shown, via sites 56B, 56D, 56E, 56F, 56G, 56J, 56K, 56M, 56N, and 56P, 56Q, 56R, 56S, 56T, 56U, 56V are selected, connecting circuitry components to implement a pair of pull-up termination to power rail circuits. FIG. 8B illustrates a simplified schematic illustration of the two pull-up termination to power rail circuits at Pad P and Pad N.

Figure 9A:
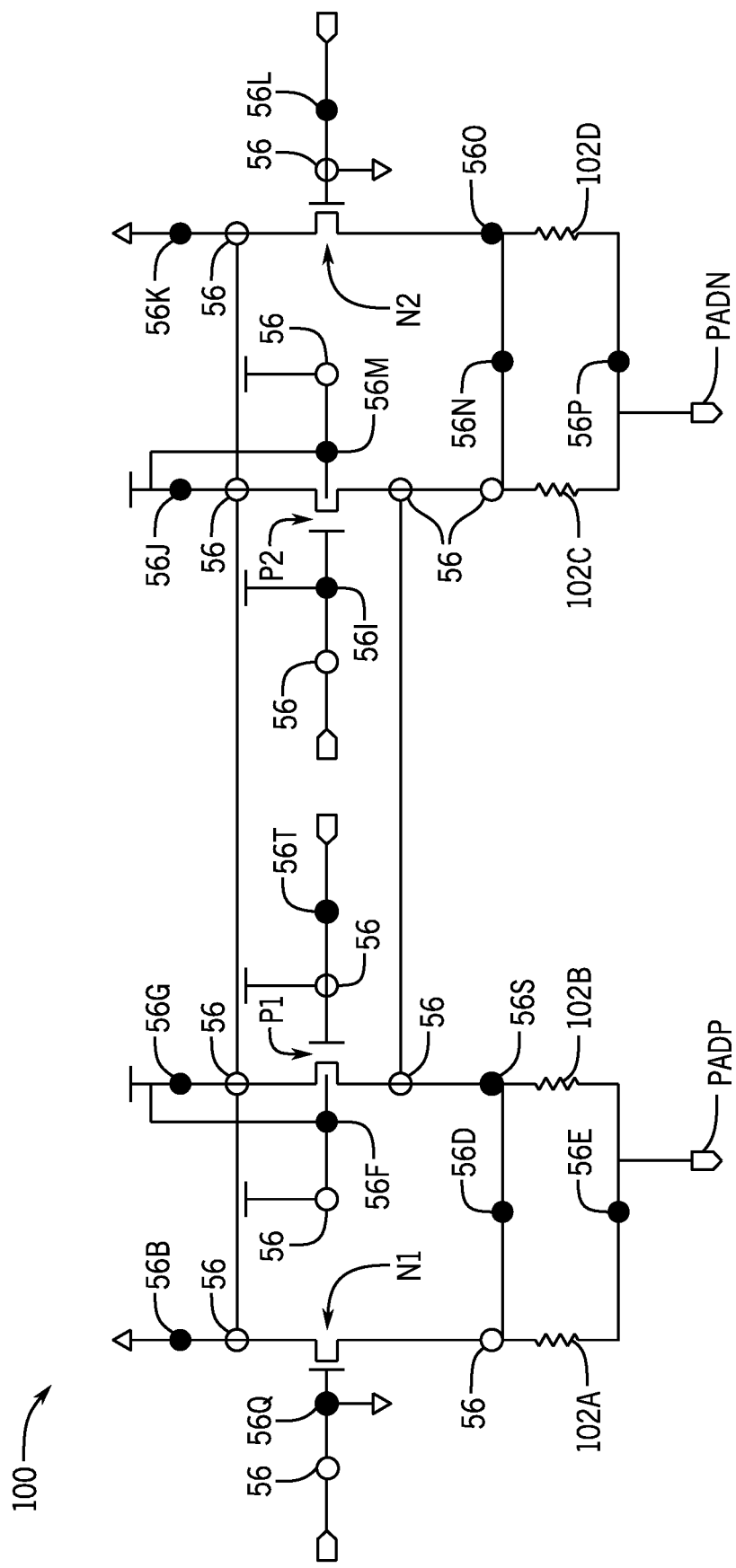
FIG. 9A illustrates a schematic diagram of the configurable ODT circuitry of FIG. 6 in a third via configuration, the configurable ODT circuitry configured as one pull-down termination to ground circuit and one pull-up termination to power rail circuit, in accordance with an embodiment of the present disclosure.
Figure 9B:
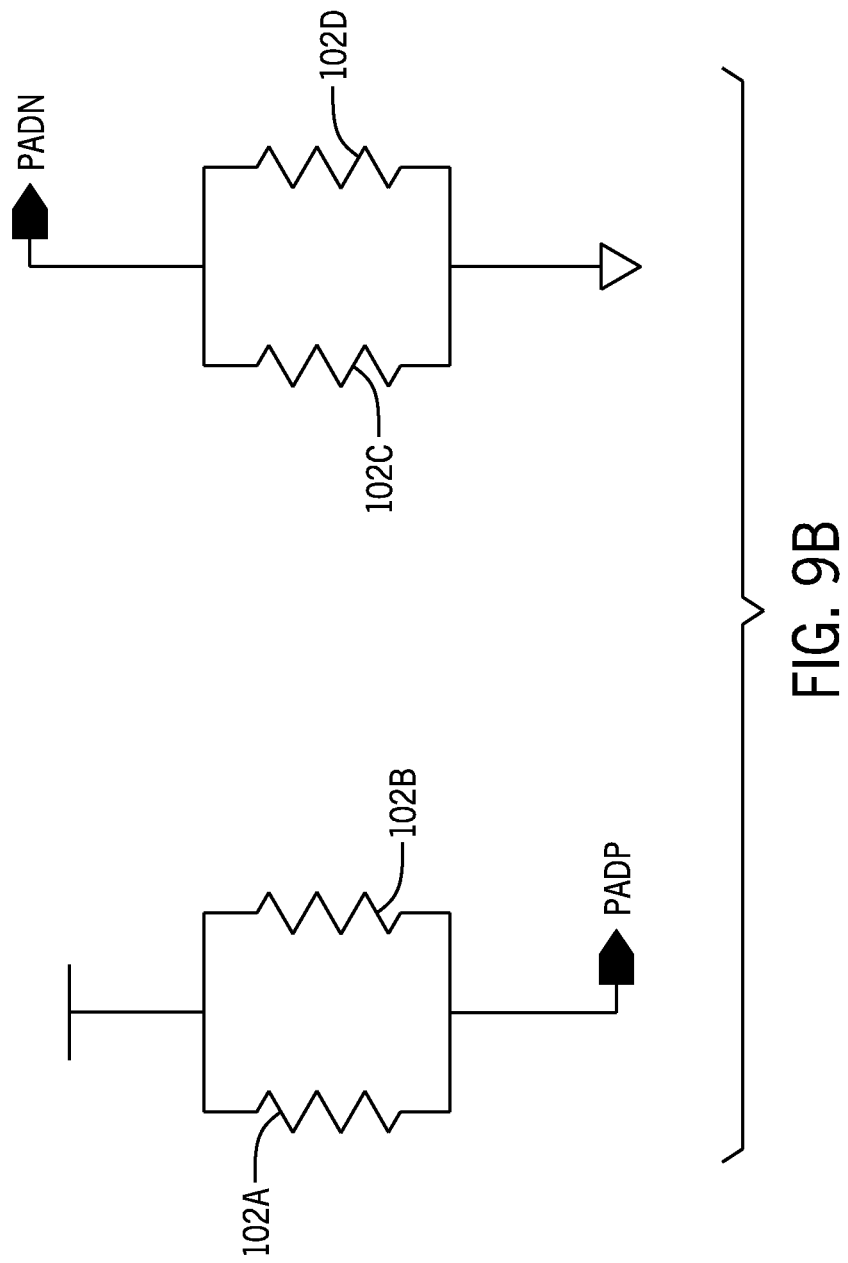
FIG. 9B illustrates a simplified schematic diagram of the configurable ODT circuitry of FIG. 9A, in accordance with an embodiment of the present disclosure.

FIG. 9A illustrates the configurable ODT circuit 100 of FIG. 6 in a third via configuration, the configurable ODT circuit 100 configured as a pair of single-ended termination circuits, such as a pull-up termination circuit at Pad P and a pull-down termination circuit at Pad N. For example, the pull-up termination to power rail circuit and pull-down termination to ground circuit may include, but is not limited to, DDR2, DDR3, DDR4, LPDDR4, RLDRAM3, and ONFI. As shown, via sites 56B, 56D, 56E, 56F, 56G, 56J, 56K, 56L, 56M, 56N, 56O, 56P, 56Q, and 56S, 56T are selected, connecting circuitry components to implement a pull-up termination circuit at Pad P and a pull-down termination circuit at Pad N. FIG. 9B illustrates a simplified schematic illustration of the pull-up termination circuit at Pad P and pull-down termination circuit at Pad N.

Figure 10A:
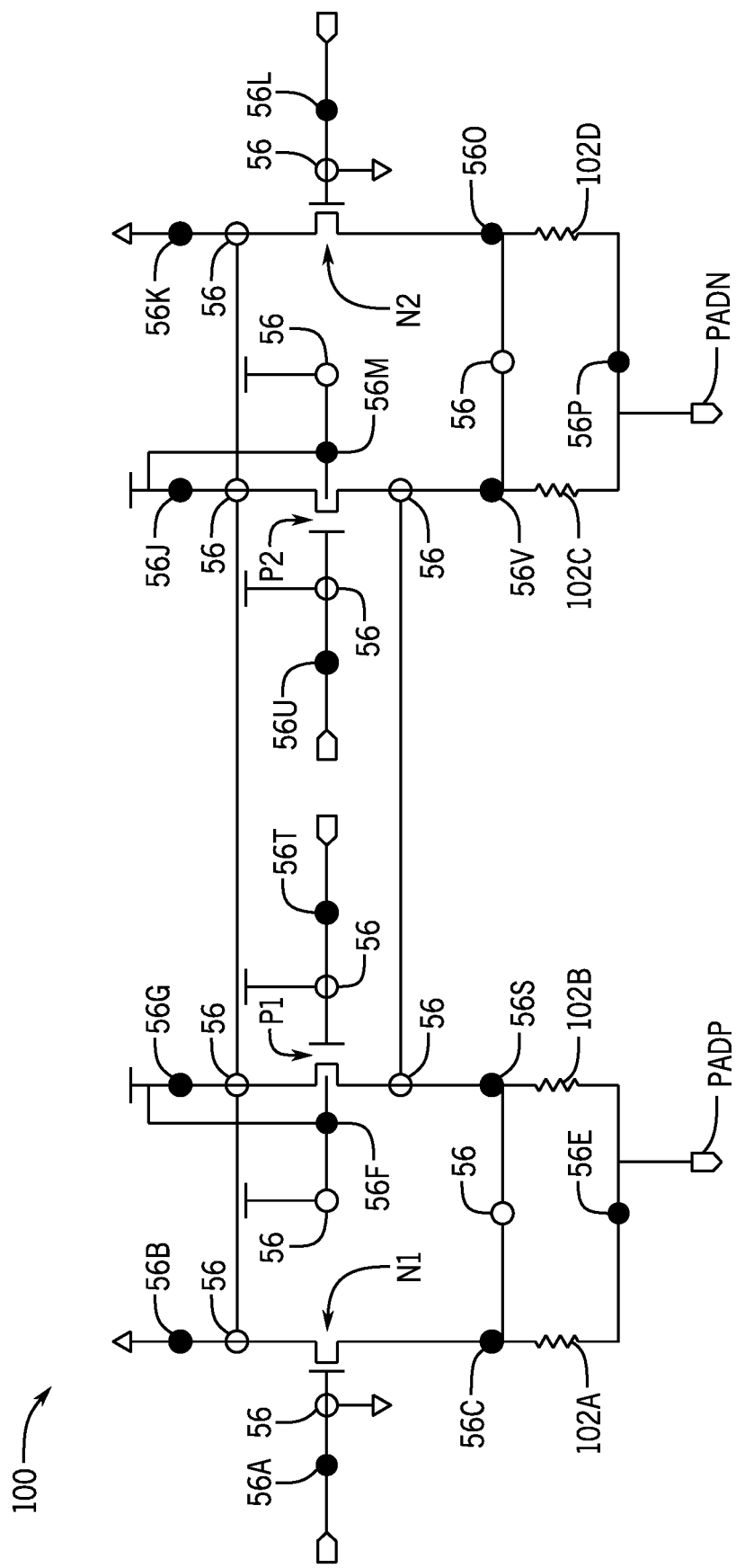
FIG. 10A illustrates a schematic diagram of the configurable ODT circuitry of FIG. 6 in a fourth via configuration, the configurable ODT circuitry configured as a pair of Thevenin termination circuits, in accordance with an embodiment of the present disclosure

FIG. 10A illustrates the configurable ODT circuit 100 of FIG. 6 in a fourth via configuration, the configurable ODT circuit 100 configured as two split Thevenin termination circuits at Pad P and Pad N. For example, the split Thevenin termination circuits may include, but are not limited to, DDR2, DDR3, DDR4, LPDDR4, RLDRAM3, and ONFI. As shown, via sites 56A, 56B, 56C, 56E, 56F, 56G, 56J, 56K, 56L, 56M, 56O, 56P, and 56S, 56T, 56V are selected, connecting circuitry components to implement a pair of split Thevenin termination circuits at Pad P and Pad N.

Figure 11A:
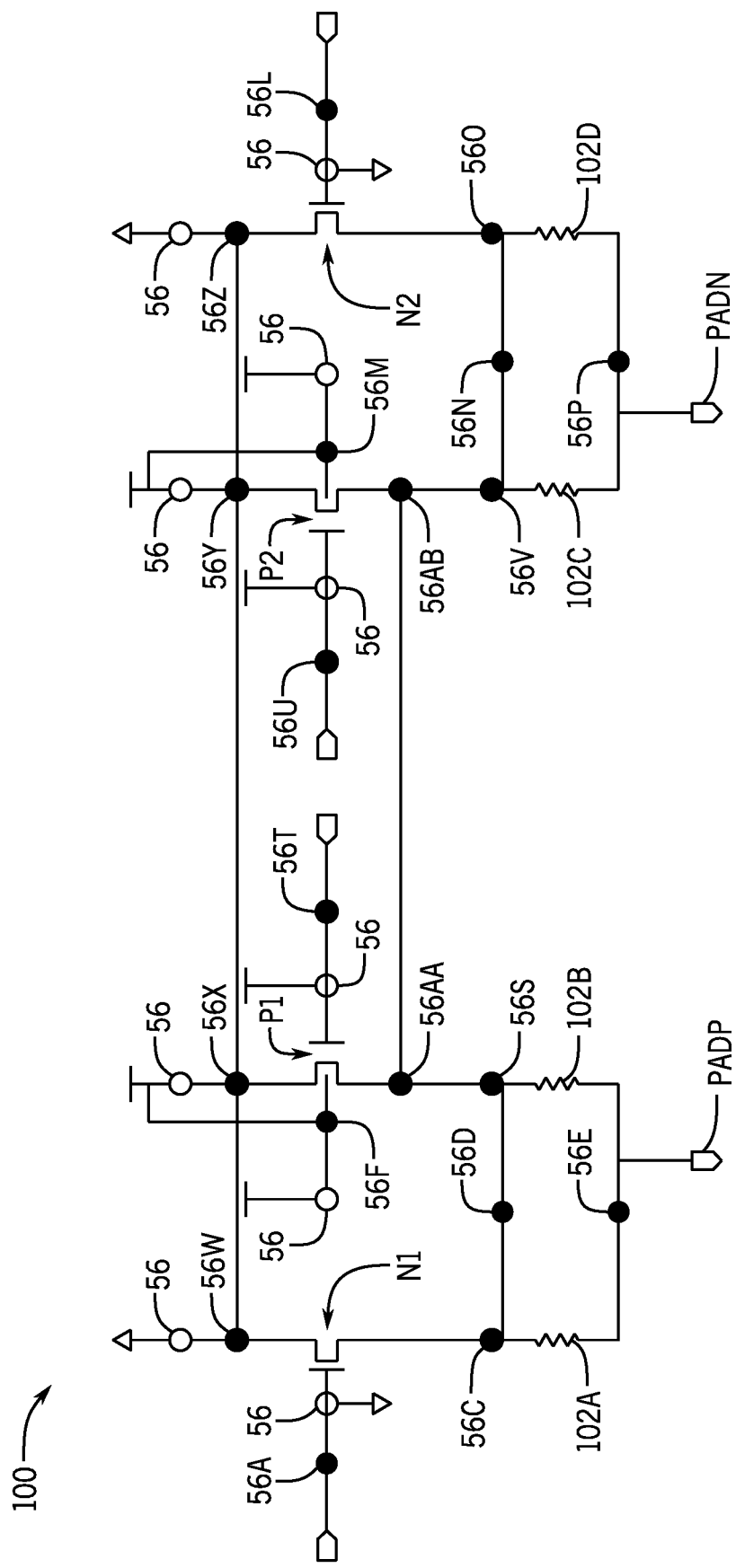
FIG. 11A illustrates a schematic diagram of the configurable ODT circuitry of FIG. 6 in a fifth via configuration, the configurable ODT circuitry configured as a differential termination circuit, in accordance with an embodiment of the present disclosure.

FIG. 11A illustrates the configurable ODT circuit 100 of FIG. 6 in a fifth via configuration, the configurable ODT circuit 100 configured as a differential termination circuit between Pad P and Pad N. For example, the differential termination circuit may include, but is not limited to, low-voltage differential signaling (LVDS), Sub-LVDS, transition minimized differential signaling (TMDS), and current mode logic (CML). As shown, via sites 56A, 56C, 56D, 56F, 56L, 56M, 56N, 56O, 56P, 56S, 56T, 56U, 56V, 56W, 56X, 56Y, 56Z, and 56AA, 56AB are selected, connecting circuitry components to implement a differential termination circuit between Pad P and Pad N.

Figure 11B:
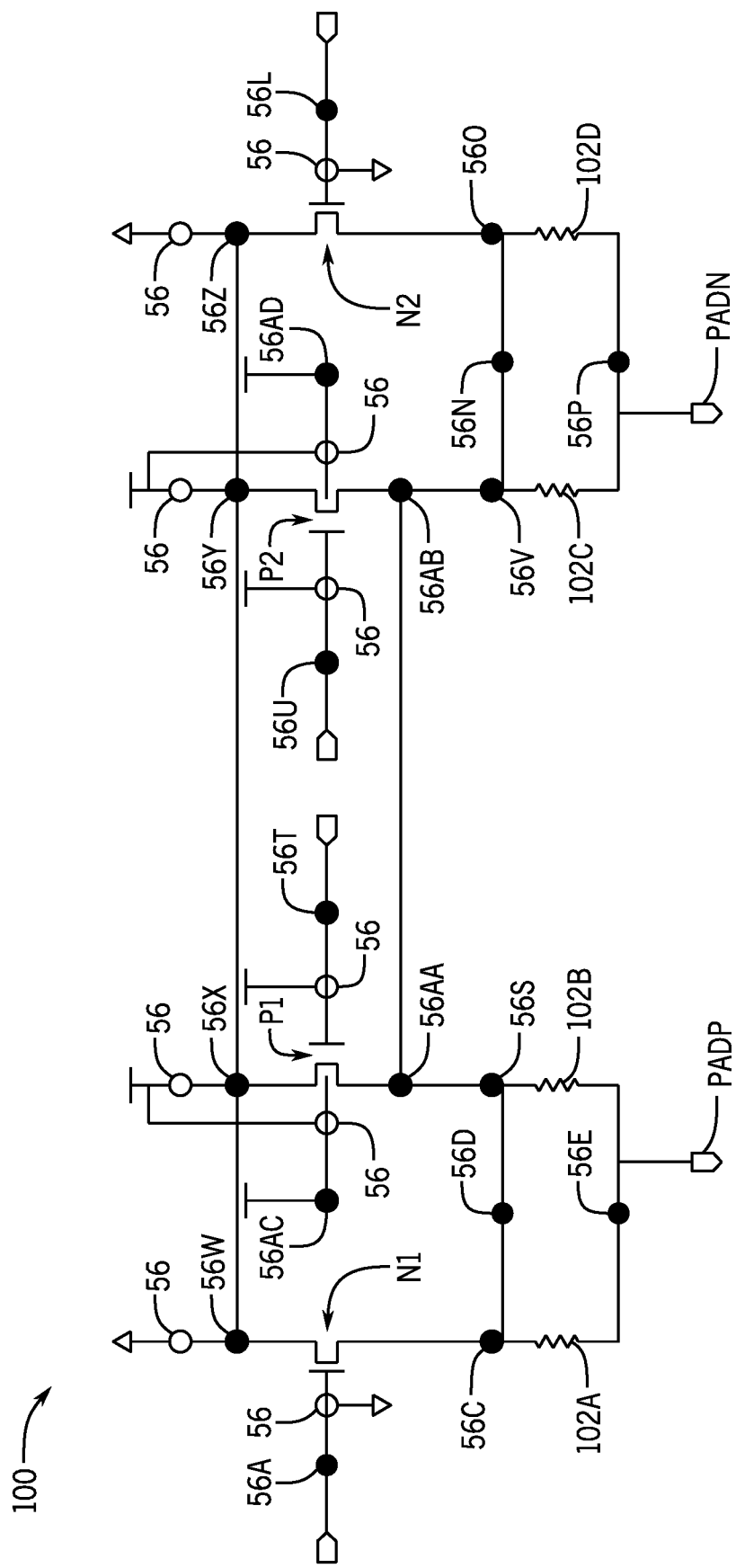
FIG. 11B illustrates a schematic diagram of the configurable ODT circuitry of FIG. 6 in a sixth via configuration, the configurable ODT circuitry configured as a differential termination circuit with voltage overstress protection, in accordance with an embodiment of the present disclosure.
Figure 11C:
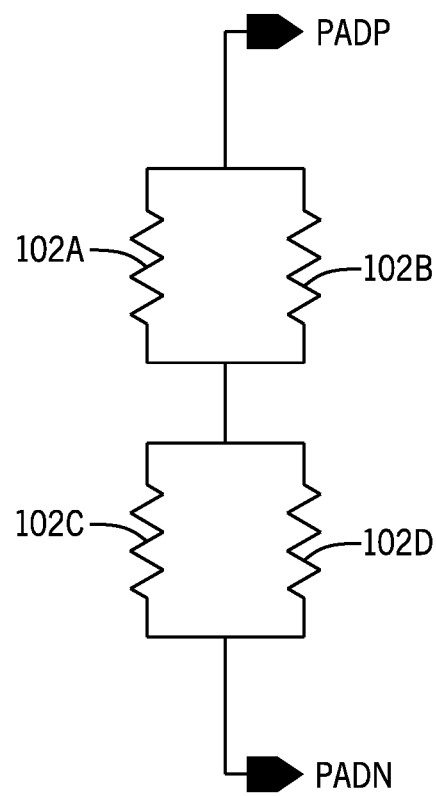
FIG. 11C illustrates a simplified schematic diagram of the configurable ODT circuitry of FIGS. 11A and 11B, in accordance with an embodiment of the present disclosure.

FIG. 11B illustrates the configurable ODT circuit 100 of FIG. 6 in a sixth via configuration, the configurable ODT circuit 100 configured as a differential termination circuit between Pad P and Pad N with voltage overstress protection. For example, the differential termination circuit with voltage overstress protection may include, but is not limited to, LVDS, Sub-LVDS, TMDS, and CML. In some applications, the configurable ODT circuit 100 may be overpowered, causing transistors P1 and P2 to be powered beyond their defined range of tolerance, such as, past a voltage threshold. For example, the transistors P1 and P2 may be set to tolerate 1.8 V of power but the application for which they are used may supply 3.3 V. In such circumstances, and in the depicted embodiment, the transistors P1 and P2 may be protected with a biasing level. This may allow the transistors P1 and P2 to drive signals at a high voltage (e.g., 3.3 V) without long term damage. As shown, via sites 56A, 56C, 56D, 56F, 56L, 56M, 56N, 56O, 56P, 56S, 56T, 56U, 56V, 56W, 56X, 56Y, 56Z, and 56AA, 56AB, 56AC, 56AD are selected, connecting circuitry components to implement a differential termination circuit between Pad P and Pad N. FIG. 11C illustrates a simplified schematic illustration of the differential termination circuits of FIGS. 11A and 11B.

Figure 12:
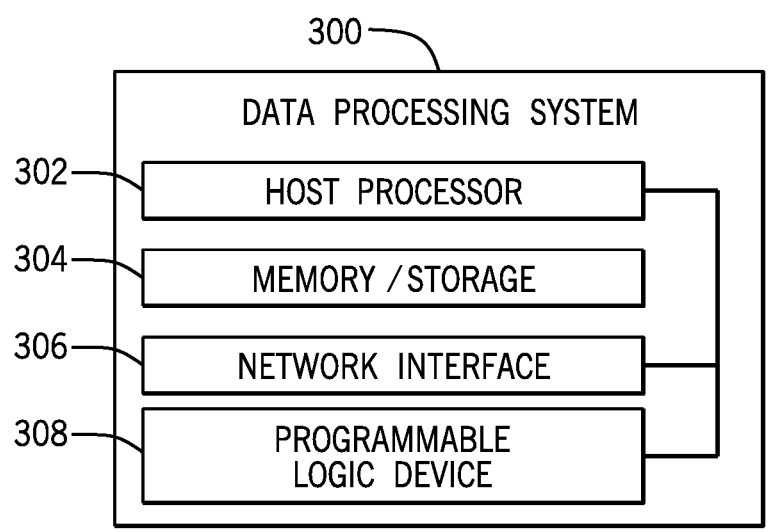
FIG. 12 illustrates a block diagram of a data processing system that may use the integrated circuit device, in accordance with an embodiment of the present disclosure.

With the foregoing in mind, the integrated circuit device 12 may be a part of a data processing system or may be a component of a data processing system that may benefit from using the techniques discussed herein. For example, the integrated circuit device 12 may be a component of a data processing system 300, shown in FIG. 12. The data processing system 300 includes a host processor 302, memory and/or storage circuitry 304, a network interface 306, and a programmable logic device 308. The data processing system 300 may include more or fewer components (e.g., electronic display, user interface structures, application specific integrated circuits (ASICs)). In some cases, a plurality of integrated circuit devices 12 may be components of the data processing system 300. For example, each of the plurality of integrated circuit devices 12 may include a particular via configuration for a particular termination circuit.

The host processor 302 may include any suitable processor, such as an INTEL® XEON® processor or a reduced-instruction processor (e.g., a reduced instruction set computer (RISC), an Advanced RISC Machine (ARM) processor) that may manage a data processing request for the data processing system 300 (e.g., to perform machine learning, video processing, voice recognition, image recognition, data compression, database search ranking, bioinformatics, network security pattern identification, spatial navigation, or the like). The memory and/or storage circuitry 304 may include random access memory (RAM), read-only memory (ROM), one or more hard drives, flash memory, or the like. The memory and/or storage circuitry 304 may be considered external memory to the integrated circuit device 12 and may hold data to be processed by the data processing system 300 and/or may be internal to the integrated circuit device 12. In some cases, the memory and/or storage circuitry 304 may also store configuration programs for programming a programmable fabric of the integrated circuit device 12. The network interface 306 may permit the data processing system 300 to communicate with other electronic devices. The data processing system 300 may include several different packages or may be contained within a single package on a single package substrate.

In one example, the data processing system 300 may be part of a data center that processes a variety of different requests. For instance, the data processing system 300 may receive a data processing request via the network interface 306 to perform machine learning, video processing, voice recognition, image recognition, data compression, database search ranking, bioinformatics, network security pattern identification, spatial navigation, or some other specialized task. The host processor 302 may cause a programmable logic fabric of the integrated circuit device 12 to be programmed with a particular accelerator related to the requested task. For instance, the host processor 302 may instruct that configuration data be stored on the memory and/or storage circuitry 304 or cached in sector-aligned memory of the integrated circuit device 12 to be programmed into the programmable logic fabric of the integrated circuit device 12. The configuration data may represent a circuit design for a particular accelerator function relevant to the requested task.

The processes and devices of this disclosure may be incorporated into any suitable circuit. For example, the processes and devices may be incorporated into numerous types of devices such as microprocessors or other integrated circuits. Exemplary integrated circuits include programmable array logic (PAL), programmable logic arrays, (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit device comprising:
a termination circuit; and
a via layer that, based on a via configuration of the via layer, causes the termination circuit of the integrated circuit device to function as:
one or more pull-up termination to power rail circuits in a first via configuration;
one or more pull-down termination to ground circuits in a second via configuration;
a Thevenin termination circuit in a third via configuration;
a differential termination circuit in a fourth via configuration; and
a voltage overstress protection circuit in a fifth via configuration.

2. The integrated circuit device of claim 1, wherein the termination circuit comprises a plurality of resistors, a plurality of transistors, or any combination thereof.

3. The integrated circuit device of claim 2, wherein the integrated circuit device is configured to operate using multiple power supply values, wherein the multiple power supply values comprise at least a voltage greater than a voltage threshold for the plurality of transistors.

4. The integrated circuit device of claim 1, wherein the first via configuration comprises a first configuration of via sites in the via layer, the second via configuration comprises a second configuration of the via sites in the via layer, the third via configuration comprises a third configuration of the via sites in the via layer, the fourth via configuration comprises a fourth configuration of the via sites in the via layer, and the fifth via configuration comprises a fifth configuration of the via sites in the via layer, and wherein the first via configuration of the via sites, the second via configuration of the via sites, the third via configuration of the via sites, the fourth via configuration of the via sites, and the fifth via configuration of the via sites, are different.

5. The integrated circuit device of claim 1, wherein the via layer comprises a plurality of vertical segments, a plurality of horizontal segments, or any combination thereof.

6. The integrated circuit device of claim 5, wherein the plurality of vertical segments, the plurality of horizontal segments, or any combination thereof, are connected using one or more jumpers.

7. The integrated circuit device of claim 6, wherein the jumpers allow reconfiguring the via layer, and wherein the reconfiguring results in connecting or disconnecting a plurality of transistors of the termination circuit, a plurality of resistors of the termination circuit, or any combination thereof, based on the reconfiguration of the via layer.

8. The integrated circuit device of claim 1, wherein the via layer is associated with a single photomask.

9. The integrated circuit device of claim 1, wherein the integrated circuit device comprises a multiplexer circuit, wherein the multiplexer circuit allows a dynamic configuration of the first via configuration, the second via configuration, the third via configuration, the fourth via configuration, or the fifth via configuration.

10. A configurable circuit, comprising:
   a circuit comprising a plurality of resistors, a plurality of transistors, or any combination thereof; and
   a plurality of vias connected to at least a portion of the circuit to implement:
      when configured in a first via configuration, a single-ended termination circuit;
      when configured in a second via configuration, a Thevenin termination circuit;
      when configured in a third via configuration, a differential termination circuit; and
      when configured in a fourth via configuration, a voltage overstress protection circuit.

11. The configurable circuit of claim 10, wherein the configurable circuit is configured to operate using multiple power supply values, wherein the multiple power supply values comprise at least a voltage greater than a voltage threshold for the plurality of transistors.

12. The configurable circuit of claim 10, wherein the single-ended termination circuit includes a pull-up termination to power rail circuit.

13. The configurable circuit of claim 10, wherein the single-ended termination circuit includes a pull-down termination to ground circuit.

14. The configurable circuit of claim 10, wherein the single-ended termination circuit includes a pull-up termination to power rail circuit and a pull-down termination to ground circuit.

15. The configurable circuit of claim 10, wherein the plurality of vias comprises a plurality of vertical segments, a plurality of horizontal segments, or any combination thereof.

16. The configurable circuit of claim 15, wherein the plurality of vertical segments, the plurality of horizontal segments, or any combination thereof, are connected using one or more jumpers.

* * * * *